United States Patent [19]
Raschle

[11] 3,949,618
[45] Apr. 13, 1976

[54] FRICTION DISC FOR DRIVING TWIST TUBES ROTATING AT HIGH REVOLUTION SPEEDS

[75] Inventor: Josef Raschle, Buetschwil, Switzerland

[73] Assignee: Heberlein & Co., Wattwil, Switzerland

[22] Filed: Mar. 19, 1975

[21] Appl. No.: 559,772

[30] Foreign Application Priority Data
Apr. 1, 1974 Switzerland.................. 4484/74

[52] U.S. Cl. .................. 74/215; 74/206; 57/77.45; 57/103
[51] Int. Cl.² .................. F16H 55/34; B21B 27/00
[58] Field of Search.................. 74/206, 214, 215; 57/77.45, 103; 192/107 M

[56] References Cited
UNITED STATES PATENTS
3,613,467   10/1971   Lee ........................................ 74/215
3,831,366   8/1974   Raschle ............................ 57/77.45

*Primary Examiner*—Samuel Scott
*Assistant Examiner*—A. Russell Burke
*Attorney, Agent, or Firm*—Larson, Taylor & Hinds

[57] ABSTRACT

A friction disc is described for very quietly driving twist tubes at several hundred thousand revolutions per minute in a false-twist device for texturing synthetic filaments. The disc has a titanium alloy support flange having a specific electrical resistance of between 1 and 2 $\Omega/mm^2/m$, a modulus of elasticity of at least 6500 $kg/mm^2$ and an ultimate tensile strength of at least 25 $kg/mm^2$. The support flange has a circular cylindrical circumferential surface which fits and is rigidly fixed to the internal surface of a polyurethane friction ring, the external cylindrical surface of which frictionally drives the twist tube. A twist tube driving roller has two such discs spaced apart on a steel driving shaft.

4 Claims, 2 Drawing Figures

FRICTION DISC FOR DRIVING TWIST TUBES ROTATING AT HIGH REVOLUTION SPEEDS

FIELD OF THE INVENTION

The present invention relates to a friction disc for driving twist tubes rotating at high revolution speeds for use in a false-twist device for texturing synthetic filaments. The invention also relates to rollers incorporating such discs.

DESCRIPTION OF THE PRIOR ART

False-twist devices are known, comprising twist tubes supported in tangential contact with friction discs in the wedge-shaped throat between two axially parallel rollers, one roller being driven and the other idling as guide roller. The twist tubes are preferably pressed against the rollers by means of magnets. There are particular problems with friction discs for false-twist devices of this kind since, for achieving the extremely high revolution speeds of the twist tubes of over 100,000 r.p.m., the friction discs must rotate at correspondingly high revolution speeds. Up to now, it was quite common practice to produce such friction discs, as a rule, in one piece of an elastic synthetic material, particularly of polyurethane. It has however been proved that such friction discs, in operation, because of the strong centrifugal forces occurring at the high revolution speeds, are deformed asymmetrically so that quiet running of the friction disc concerned as well as of the twist tube driven thereby is disturbed to a great extent.

In order to eliminate this defect, friction discs have already been proposed which consist of a support of a material of low elasticity and relatively high rigidity, for example a synthetic material such as polyacetal resin or metal, such as steel or aluminium, and of a disc rim of an elastic synthetic material, particularly polyurethane. In the known friction discs, as a rule, the disc support is connected with the disc rim mechanically, for example by interfitting projections and cavities, which makes the production of such friction discs relatively complicated and expensive. Furthermore, the cavities and projections necessary for anchoring the parts to be connected present the disadvantage that, under the effect of the centrifugal forces occurring because of the high revolution speeds, also asymmetrical deformations appear which prevent the friction disc and the twist tube from rotating quietly.

If pressing of the twist tubes against the rollers carrying the friction discs is effected by means of magnets, the use of supports consisting of steel or aluminium has the further disadvantage that, because of the relatively low specific electrical resistance of these metals, relatively high eddy current losses appear.

SUMMARY OF THE INVENTION

It is the purpose of the present invention to provide a friction disc for driving false-twist tubes in which undesirable deformations due to the strong centrifugal forces at extremely high revolution speeds are avoided and, when using magnets for holding the twist tubes, the eddy current losses can be kept within acceptable limits.

According to the invention this object is achieved by a friction disc for driving twist tubes rotating at high revolution speeds for use in false-twist devices for texturing synthetic filaments, which consists of a support flange of a non-resilient material and of a friction ring of resilient synthetic material forming the disc rim, and which is characterized by a support flange which consists of a metal alloy having a specific electrical resistance of between 1 and 2 $\Omega/mm^2/m$ (ohm per square millimeter per meter) inclusive as well as a modulus of elasticity of at least 6500 $kg/mm^2$ and a break-resistance (i.e. ultimate tensile strength) of at least 25 $kg/mm^2$ (kilogrammes per square millimeter) and has a circular cylindrical circumferential surface which is rigidly fixed to the inner surface of the friction ring. The support flange may preferably consist of a titanium alloy.

In the friction disc according to the present invention, due to the circular cylindrical circumferential surfaces of the support flange and the relatively high modulus of elasticity together with the high rigidity of the metal alloy used, no undesirably resilient deformations occur under the effect of centrifugal forces even when operating at the revolution speeds that are necessary for achieving the desired twist tube revolution speeds of 600,000 r.p.m. and more. As practice has shown, extremely quiet running is assured, particularly also quiet running of the driven twist tube. Furthermore, the eddy current losses, relatively to those in rollers having support flanges made from aluminium or steel, are very low since the specific electrical resistance of titanium alloys is between 40 and 50 times higher than that of aluminium and approximately 15 times higher than that of steel.

DESCRIPTION OF THE DRAWINGS

An example of the present invention will hereinafter be described in more detail with reference to the attached drawings wherein.

Figure 1:
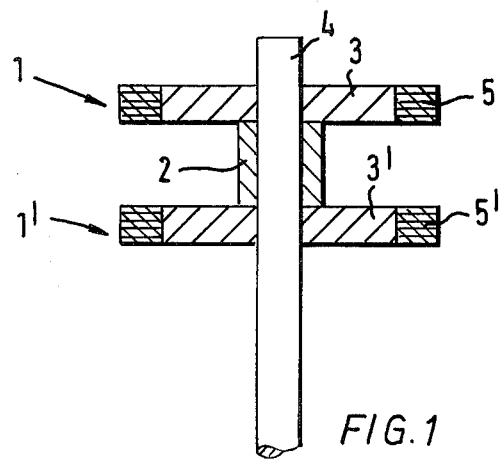
FIG. 1 shows a central longitudinal section through a driving roller comprising driving discs according to the present invention.
Figure 2:
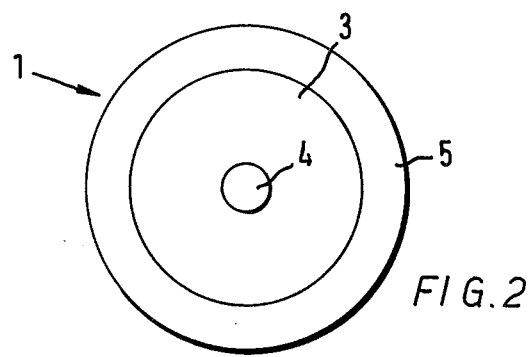
FIG. 2 shows a plan view of the driving roller of FIG. 1.

The driving roller consists of two precisely similar friction discs 1, 1' which are kept apart by a spacer sleeve 2 consisting of a non-magnetic material, for example brass. Each friction disc comprises a support flange 3, 3' which is circular and pressed onto a steel shaft 4. The support flanges 3, 3' consist of a titanium alloy having a specific electrical resistance of 1.71 $\Omega/mm^2/m$, a modulus of elasticity of 11,600 $kg/mm^2$ and a break-resistance (ultimate tensile strength) of 91 $kg/mm^2$. Each support flange is solidly and reliably connected with a friction ring 5,5' of polyurethane forming the disc rim, the inner circumferential surface of which exactly corresponds to the outer circumferential surface of the support flange, by means of an adhesion increasing agent and an adhesive.

The steel shaft 4 can be driven at high revolution speeds in a manner not shown. Also with extremely high revolution speeds in operation, the friction rings 5,5' of the friction discs 1, 1' do not show any circumferential irregularities whereby extremely quiet running of the twist tubes (not shown) is assured.

The kilogram unit referred to in this specification is a force unit, sometimes referred to as a kilopond unit and represents the weight of the unitary mass of 1000 grammes at a place of normal terrestial gravity.

I claim:

1. A friction disc for driving twist tubes rotating at high revolution speeds for use in a false-twist device for texturing synthetic filaments, comprising a non-resilient support flange presenting a circular cylindrical circumferential surface and consisting of a metal alloy having a specific electrical resistance of between 1 and 2 $\Omega/mm^2/m$ inclusive so as to reduce eddy current losses when utilized in a magnetic field, a modulus of elasticity of at least 6500 kg/mm² and an ultimate tensile strength of at least 25 kg/mm², and a friction ring of resilient synthetic material presenting an internal circular cylindrical surface and an external circular cylindrical surface for frictionally driving a twist tube, said internal circular cylindrical surface being rigidly fixed to said circumferential surface of said support flange.

2. A friction disc according to claim 1, in which said metal alloy is a titanium alloy.

3. A friction disc according to claim 1, in which said resilient synthetic material is polyurethane.

4. A driving roller for driving twist tubes rotating at high revolution speeds for use in a false-twist device for texturing synthetic filaments, said driving roller comprising a steel shaft, two similar spaced non-resilient support flanges presenting circular cylindrical circumferential surfaces and formed with central apertures pressed on said shaft, each said support flange having a specific electrical resistance of between 1 and 2 $\Omega/mm^2/m$ so as to reduce eddy current losses when utilized in a magnetic field, a modulus of elasticity of at least 6500 kp/mm² and an ultimate tensile strength of at least 25 kp/mm², a spacer sleeve on said shaft between said support flanges, and two similar friction rings of resilient synthetic material, each presenting an internal circular cylindrical surface and an external circular cylindrical surface for frictionally driving a twist tube, and each said internal circular cylindrical surface being rigidly fixed to a respective one of said circumferential surfaces on said support flanges.

* * * * *